US006645568B1

(12) United States Patent
Seitz et al.

(10) Patent No.: US 6,645,568 B1
(45) Date of Patent: Nov. 11, 2003

(54) PROCESS FOR PRODUCING TITANIUM DIBORIDE COATED SUBSTRATES

(75) Inventors: Katharina Seitz, Franfurt (DE); Stephan Süssbrich, Königstein (DE); Michael Hornung, Frankfurt (DE); Heinrich Kühn, Brechen (DE); Frank Hiltmann, Kriftel (DE)

(73) Assignee: Aventis Research & Technologies GmbH & Co KG (DE)

( * ) Notice: Subject to any disclaimer, the term of this patent is extended or adjusted under 35 U.S.C. 154(b) by 0 days.

(21) Appl. No.: 09/402,552

(22) PCT Filed: Mar. 24, 1998

(86) PCT No.: PCT/EP98/01729

§ 371 (c)(1),
(2), (4) Date: Dec. 6, 1999

(87) PCT Pub. No.: WO98/45497

PCT Pub. Date: Oct. 15, 1998

(30) Foreign Application Priority Data

Apr. 8, 1997 (DE) .......................................... 197 14 433

(51) Int. Cl.$^7$ .................................................. C23C 4/10
(52) U.S. Cl. ....................................... 427/446; 427/453
(58) Field of Search ................................ 427/446, 453, 427/455

(56) References Cited

U.S. PATENT DOCUMENTS

| 4,308,115 A | * | 12/1981 | Foster, Jr. et al. ............ 204/67 |
| 4,354,918 A | * | 10/1982 | Boxall et al. ................ 204/286 |
| 4,808,487 A | * | 2/1989 | Gruenr ........................ 428/610 |

FOREIGN PATENT DOCUMENTS

| DE | 2305281 | 8/1973 |
| WO | 96/29443 | 9/1996 |

OTHER PUBLICATIONS

Metals Handbook, Ninth Edition, vol. 5: Surface Cleaning, Finishing, and Coating, American Society For Metals, pp. 363–366 and 368, 1982.*

* cited by examiner

Primary Examiner—Katherine A. Bareford
(74) Attorney, Agent, or Firm—Connolly Bove Lodge & Hutz LLP

(57) ABSTRACT

The invention relates to a process for producing a coating having a titanium boride content of at least 80% by weight, in which a coating having a thickness of from 0.1 mm to 1 mm, a porosity of not more than 10% by volume and an oxygen content of less than 1% by weight is applied to the surface of a substrate by plasma spraying in an atmosphere which is virtually or completely free of oxygen, with no metallic powder being added to the spraying powder.

15 Claims, No Drawings

PROCESS FOR PRODUCING TITANIUM DIBORIDE COATED SUBSTRATES

BACKGROUND OF THE INVENTION

The present invention relates to a process for producing a coating having a titanium boride content of at least 80% by weight, a thickness of from 0.1 mm to 1 mm, a porosity of not more than 10% by volume and an oxygen content of less than 1% by weight by plasma spraying.

For the isolation of aluminum by electrolysis of aluminum oxide, aluminum oxide powder is dissolved in an electrolyte, known as the fluoride melt, which consists predominantly of cryolite. The cathodically deposited aluminum collects under the fluoride melt on the bottom of the cell which consists essentially of carbon blocks, with the surface of the liquid aluminum or a solid which can be wetted by this forming the cathode. The electric current flows in on the cathode side through the carbon blocks which are joined to one another by heat- and corrosion-resistant adhesive or tamped compositions and are enclosed by a metal tank or a container. The electric current is supplied to the carbon blocks via conductor rails or bars which are let into recesses in the carbon blocks and are connected to the latter. Anodes consisting essentially of carbon in conventional processes and fixed to the anode bar dip into the electrolyte from above. At the anodes, the electrolytic decomposition of the aluminum oxide forms oxygen which reacts with carbon anodes to give carbon dioxide and carbon monoxide. The electrolysis generally takes place in a temperature range from 940 to 970° C.

An important disadvantage of the cathode blocks made of carbon is that they are not readily wetted by the molten aluminum formed during operation of the electrolysis cell. For this reason, a comparatively thick aluminum metal layer covering the carbon blocks is necessary for operation of the cell. Since thick metal layers are considerably deformed by electromagnetic forces and convection currents, a comparatively large spacing is necessary between the carbon blocks and the carbon anodes located above the blocks in order to avoid possible short circuits. This leads to a higher electric power consumption of the cell. Furthermore, the metal flow generated at the phase interface between liquid aluminum/electrolyte leads, owing to the low interfacial tension, to increased chemical dissolution or to fine dispersion of the aluminum in the electrolyte. All dispersed aluminum which gets to the vicinity of the anode is reoxidized in contact with the anodically generated carbon monoxide and carbon dioxide to form aluminum oxide. This results in noticeable losses in the current yield. For these reasons, one is forced to employ an electrode spacing of from 4 to 6 cm, which is quite unusually wide for a process which usually operates at high current densities, so that the current yield losses do not become too high. To reduce the consequential higher voltage drop and energy consumption, the use of cathodes which are wetted by aluminum and allow smaller electrode spacings (interpolar distances) has therefore been proposed.

Although virtually all metals which are solid at the melting point of aluminum are readily wetted by aluminum, most of them have good to very good solubility in liquid aluminum or they form at least intermetallic phases with this very reactive metal. Only intermetallic compounds such as $TiB_2$ and $ZrB_2$ which have a high negative free enthalpy of formation, i.e. a high lattice energy, are resistant to liquid aluminum and are dissolved only slightly. Apart from wettability by liquid aluminum and resistance to liquid aluminum and cryolite/alumina melts, the ideal cathode material should meet further requirements: it has to have a sufficiently high mechanical strength to be resistant to thermal shock, be sufficiently electrically conductive and have sufficiently good adhesion to the underlying cathode blocks if it is in the form of a coating.

The potential advantages of the use of electrically conductive titanium diboride for this application have been known for over 25 years. However, attempts to use titanium diboride cathodes in commercial electrolysis cells have up to now foundered on their short life. The titanium diboride materials which were available were sensitive to intergranular penetration by aluminum metal, which finally ended in complete dissolution or destruction of the material. Other material properties completed the problem: titanium diboride is a very brittle material which is sensitive to thermal shock and has poor resistance to impacts or knocks.

However, today's energy situation combined with developments and improvements in materials technology in the last 15 years has led to renewed attempts to develop titanium diboride cathodes. Owing to the high cost of titanium diboride and the problems in producing a cathode of solid titanium diboride, various cell linings or coatings have been developed. Processes for producing current-carrying titanium diboride elements in electrolysis cells for aluminum melt flux electrolysis are described in the following prior art:

One possibility is the application of tiles or other prefabricated parts of titanium diboride or material comprising titanium diboride. The titanium diboride tiles can be produced by hot pressing or sintering. DE-A-36 38 937 describes the fitting of parts shaped in the manner of a dovetail into the surface of the carbon cathodes in order to avoid adhesively bonded joints.

In U.S. Pat. No. 5,286,359, specially shaped parts instead of tiles are fixed in the cathode surface. These parts comprise titanium diboride, $TiB_2$—Al or TiB2-graphite.

WO-A-8201018 describes a process in which TiO2, $B_2O_3$, petroleum coke and a binder are mixed, elements are shaped and subsequently calcined. The porous body formed here is impregnated with a boron compound and reheated to form a graphite-titanium diboride composite. These elements are preferably mushroom-shaped with a horizontal surface facing the underside of the anode.

Coating processes which apply a coating directly to the cathode surface are likewise used. U.S. Pat. No. 4,466,995 discloses a method of coating the cathode surface with a mixture of refractory hard material (RHM), heat-curable binder, solvent and carbon-containing filler material; the RHM is one of the compounds TiB2, TiC, $ZrB_2$ or ZrC.

EP-A-0 021 850 describes, as coating process, the electrolytic deposition of $TiB_2$ from a molten electrolyte which comprises titanium dioxide or a titanate as source of titanium and a borate as source of boron.

DE-A-23 05 281 describes a process for producing cathodes by applying a coating or an overlay of molten or highly sintered, dense refractory hard material to a surface. Hard materials used are the borides, nitrides, carbides and silicides of transition metals of groups IV to VI of the Periodic Table. This melt layer can be obtained either by heating to temperatures of from 2200 to 2300° C. or by plasma spraying.

DE-A-23 12 439 describes a process for coating a container for a cathode tank. A thin coating of electrically conductive ceramic material is applied to this container by introducing the ceramic material into an ionized gas jet of high energy content and applying the material in a molten state. To provide protection against oxidation, the ionized gas jet is surrounded by a protective shroud of inert or reducing gas.

Thesis No. 22, Jan. 19, 1989, of the Rheinisch-Wesffälischen Technischen Hochschule Aachen, "Spritztechnische Verarbeitung von Refraktärmetallen und Refraktärhartstoffen für Korrosions- und Verschleißschutzanwendungen" by Doris Jäger describes the vacuum plasma spraying of refractory metals and refractory metal compounds. 2 mm thick steel plates having an area of a few square centimeters are coated, inter alia, with titanium diboride, using a pressure of from 150 to 350 mbar. No indications of the oxygen content of the spraying powder used and the coating produced therefrom are given. The thin plates are cooled by means of argon during the coating process.

It can thus be seen that despite the fairly comprehensive efforts which have been made up to the present time and the potential advantages of using titanium diboride as current-carrying element, titanium diboride is up to now not commercially used as electrode material in the aluminum industry. The lack of acceptance is attributable to the short life in cell operation. It has been reported that such current-carrying elements have failed after only very short operating times or have not displayed the desired effect in terms of giving an energy saving.

In the case of sintered parts, this failure is linked to penetration by electrolyte or aluminum. It is known that penetration of liquid phases into the grain boundaries of sintered solids can have very undesirable effects. Titanium diboride tiles, for example, are susceptible to rapid attack by aluminum and/or cryolite melts at the grain boundaries, since the oxygen impurities preferentially accumulate at the grain boundaries during the sintering process. Past attempts to prevent the dissolution of titanium diboride tiles led to the use of high-purity titanium diboride powder. The oxygen content was less than 50 ppm and the price was three to four times higher than that of normal powder having an oxygen content of about 3000 ppm. A further disadvantage is that the production costs for the tiles increase considerably since particular sintering conditions have to be employed. No cell which has operated successfully with titanium diboride tiles for a relatively long time is known. The titanium diboride has either dissolved or the tiles have become detached from the substrate carbon owing to the different coefficients of thermal expansion of titanium diboride and carbon. Other reasons for the failure of titanium diboride tiles or coatings are the lack of mechanical strength or the low resistance to thermal shock.

Cathodes or cathode coatings made of a composite of titanium diboride with carbon, graphite and/or titanium carbide or similar hard materials are not particularly readily wetted by aluminum, so that no great energy saving effect is to be expected here. The additional constituents reduce the electric conductivity and the material which has been mixed in usually also reduces the durability since it is usually not very resistant to aluminum.

Thin Solid Films, 224, 1993, 148–152 teaches that titanium diboride coatings which have been produced by means of atmospheric plasma spraying can, owing to the method by which they are produced, contain up to 14% by weight of oxygen when the starting powder contained 2% by weight of oxygen. Thus, these coatings are very susceptible to corrosion by liquid aluminum. The use of a protective gas shroud around the plasma burner reduces the oxygen uptake by the reactive titanium diboride only to a still unsatisfactory 9% by weight.

Inert gas plasma spraying in which both the body to be coated and also the plasma burner are located totally in an inert gas atmosphere avoids the introduction of oxygen, but gas inclusions in the coating lead to a quite porous coating which offers a very large attack area for corrosion and erosion.

In our own experiments (Table I) plasma spraying under reduced pressure at from 10 to 200 mbar gave, in contrast to the thesis by Jäger, a minimal deposition efficiency, thus drastically reducing the economics of the process. The coating of small, thin plates leads to a completely different temperature distribution than in the case of large-area substrates, as indicated by the cooling with argon required by Jäger. This also results in a different coating structure, adhesion and a different deposition efficiency.

SUMMARY OF THE INVENTION

It is an object of the invention to provide a process for producing a coating comprising titanium boride for large-area substrates, in particular for carbon and/or graphite bodies, by means of which corrosion- and erosion-resistant, strongly adhering coatings which are suitable for use in an aluminum melt flux electrolysis cell can be produced. A further object is to propose an economically operating process which can be used for an industrial process.

This object is achieved by a process for producing a coated substrate in which the coating has a titanium boride content of at least 80% by weight, which process comprises applying a coating having a thickness of from 0.1 mm to 1 mm, a porosity of not more than 10% by volume and an oxygen content of less than 1% by weight to the surface of a substrate by plasma spraying in an atmosphere which is virtually or completely free of oxygen, with no metallic powder being added to the spraying powder.

DETAILED DESCRIPTION OF THE INVENTION

For a coating according to the invention to be used successfully, it has to have a titanium boride content of at least 80% by weight and a thickness of at least 0.1 mm. The comparatively high thickness is necessary because of the surface profiling which is due to the porosity and coarse structure of the substrate material. As the layer thickness increases, the mechanical stresses in the coating under the temperature changes which occur increase as a result of the different coefficients of thermal expansion of coating and substrate materials. This can lead to the formation of cracks which allow penetration of aggressive media. The maximum layer thickness should therefore be not more than 1 mm and the porosity should be at most 10% by volume. Coatings having a mean thickness of from 0.2 to 0.5 mm are particularly advantageous. Preference is given to a porosity of from 4 to 6% by volume, since here the pores do not allow bonding between substrate and medium even at relatively low layer thicknesses but the mechanical stresses in the coating caused by the residual porosity present are sufficiently small.

A decisive factor for the use of the process for producing coated substrates for use in an aluminum electrolysis cell is that the process according to the invention gives plasma-sprayed titanium boride coatings having a considerably higher purity than is the case for conventional sintering to produce titanium boride bodies or coatings. The high purity which is achieved by targeted setting of the oxygen content in the titanium boride coating to less than 1% by weight, preferably less than 0.6% by weight, virtually avoids corrosion and erosion of the coating by the metal or/and electrolyte melt.

The process of the invention is suitable for coating substrates of any shape, preferably substrates comprising carbon and/or graphite. Such bodies are, in particular, bodies comprising synthetic carbon or graphite which have been obtained from a precursor body comprising a filler mixture and a binder by treatment under high temperatures with exclusion of oxidizing substances; these are either bodies which during production have been heated to temperatures of not more than 1400° C. or bodies which during production have been heated to temperatures of more than 1600° C., preferably to temperatures of from 2400 to 3000° C. or bodies of this type which during production have been heated to temperatures of not more than 1400° C. and whose filler component comprises particulate graphite in addition to a proportion of ungraphitized carbon. The bodies are preferably large-area substrates so that areas of more than 1 m² can be coated.

The substrate surfaces can be prepared for coating by, for example, sandblasting, electric arc cleaning and/or heating to about 600° C. The substrates have to be essentially grease-free, dust-free and dry.

In order to be able to coat such large areas in a time which is acceptable for a production process, powder feed rates of at least 30 g of powder per minute, in particular from 40 to 60 g of powder per minute, have to be used. In the case of large-area cathode elements for aluminum melt flux electrolysis and layer thicknesses of from 0.2 to 0.5 mm, this leads to coating times of, on average, from 1 to 2 hours per square meter.

To ensure a uniformly high deposition efficiency and a high process reliability for the long coating times, the spraying powder used has to meet an appropriate specification. This means particularly high demands on the particle sizes or particle size distribution of the spraying powder or spraying powder mixture. Good flow and uniformity are prerequisites for a spraying powder in this application. The mean particle size of the spraying powder or spraying powder mixture should be not more than 55 $\mu$m, since when mean particle sizes are above this value the coarser powder particles do not melt sufficiently because of the short residence time in the plasma flame and because of the high melting point of titanium diboride. This leads to the inclusion of round, incompletely melted particles in the coating and consequently to mechanical stresses within the coating. Preferably, a spraying powder or a spraying powder mixture having a mean powder particle size of from 10 to 55 $\mu$m, in particular from 20 to 30 $\mu$m, is substantially or completely melted in a plasma flame.

Advantageously, a spraying powder or spraying powder mixture having a content of fines smaller than or equal to 3 $\mu$m of less than or equal to 1% by weight is melted, since small powder particles melt very rapidly in comparison to large powder particles, overheat and partly vaporize. This can lead to deposits on the wall of the plasma nozzle and thus to blocking of the nozzle. The long coating run times of from 1 to 4 hours for large-area coatings on a substrate sometimes cannot be achieved using a powder having a mean particle size which is too small or having a fines content which is too high. Apart from deposits in the nozzle, a further disadvantage is the mass loss due to vaporization which is a significant cost factor for such expensive materials. Furthermore, overheating of the titanium diboride particles can be a great disadvantage since, as can be seen from the phase diagram of E. Rudy, Technical Report AFM-TR-65-2, Part V, 1969, the $TiB_2$ phase has a narrow existence range and tends to decompose at high temperatures. This forms phases which are, in part, soluble in the melt.

A somewhat coarser spraying powder or spraying powder mixture which results in increased process reliability and also has a lower oxygen content is advantageous for the coating process. The larger specific surface area of a finer powder results in introduction of significantly more oxygen. For example, a $TiB_2$ powder fraction having a $d_{50}$ of 12 $\mu$m has an oxygen content which is twice as high as that of a particle size fraction obtained from one and the same material and having a $d_{50}$ of 21 $\mu$m. This means that it is not necessary to use a powder which is lower in oxygen as a result of a particularly complicated production process, but rather the use of a coarser particle size fraction can sufficiently reduce both the oxygen content and the costs.

It has surprisingly been found that application under a slightly reduced pressure leads to a reduction in the oxygen content of the coating compared to the starting powder used. This process functions particularly effectively when the starting powder has a certain residual carbon content which makes possible the formation of volatile compounds in the form of CO or carbonyl compounds. This makes possible a significantly more economical process since more inexpensive powder having a somewhat higher oxygen content can be used and a coating having the necessary purity is still obtained. However, the carbon content must not be too high since this results in formation of TiC which has a lower corrosion resistance in the present of liquid aluminum.

If carbon is essentially absent in the powder, the oxygen content of the spraying powder or spraying powder mixture which is to be melted is preferably less than or equal to 1% by weight. If the oxygen content is above 1% by weight, an increased carbon content should also be present in proportion thereto. The ratio of oxygen content to carbon content in the spraying powder or spraying powder mixture is then preferably in the range from 0.7:1 to 5:1.

For the purposes of the present invention, the term spraying powder refers not only to a very pure powder grade but also to a technical grade which, owing to its method of production, has a low content of various impurities. Typical impurities apart from the abovementioned main impurities oxygen and carbon are, for example, nitrogen, iron and other metallic impurities. The sum of these contents is usually less than 2.5% by weight, often less than 1% by weight. In the process of the invention, no metallic powder is added to the spraying powder. The metallic impurities are preferably ≦1% by weight, particularly preferably ≦0.5% by weight, very particularly preferably ≦0.1% by weight. In the data quoted for compositions of the spraying powder or spraying powder mixtures for the present invention, the impurities resulting from the production method are not mentioned explicitly; rather, calculations are based on a 100%-pure material. In the process of the invention, preference is given to producing a coating having a content of metallic impurities of <1% by weight, in particular ≦0.5% by weight.

In the process of the invention, the material is applied in an inert or reducing protective atmosphere, i.e. in an atmosphere which is virtually or completely free of oxygen. For the purposes of the present application, virtually free of oxygen means an oxygen content of up to 3% by volume of the chamber atmosphere, preferably up to 1% by volume, particularly preferably only up to 0.1% by volume. This prevents reaction of the borides with oxygen to form oxides. As the pressure in the coating chamber decreases, the density of the coating produced increases because the spraying powder particles impinge on the surface at a greater speed than in the case of plasma spraying under atmospheric pressure. A lower porosity reduces the attack area for the corrosive melt in use. The higher particle speeds at lower pressures additionally promote the formation of a coating joined closely to the surface of the substrate. However, the deposition efficiency (ratio of the amount of powder applied as coating to the amount of powder fed in) decreases with decreasing atmospheric pressure in the coating chamber. At pressures below 500 mbar, the deposition efficiency even tends to zero. A reduction in the pressure in the coating chamber can thus significantly increase production costs since starting powder is a large cost factor. According to the invention, the process can be optimized so that the porosity of the coating is suitable for the intended use, the adhesion to the surface is satisfactory and the deposition efficiency is economical. Preferably, plasma spraying is carried out in a virtually or completely oxygen-free atmosphere at a pressure of at least 500 mbar, in particular from 750 to 950 mbar. In the process of the invention, it is advantageous to melt the $TiB_2$ particles substantially or completely. This is advisable since without low-melting, e.g. metallic or oxidic, binder phases, consolidation of the coating is difficult.

As plasma gas, use is made, in particular, of a mixture consisting essentially of argon and hydrogen. The plasma flame is preferably operated using a plasma gas mixture containing from 60 to 80% by volume of argon and from 40 to 20% by volume of hydrogen. At this composition, the energy necessary for the high-melting titanium boride particles is introduced and sufficiently good melting of the powder particles is achieved.

The adhesion of the titanium boride coating of the invention to the substrate comprising carbon or/and graphite is so strong that a crack formed on stressing of the coating, e.g. by means of an impact or knock, does not, insofar as it runs essentially parallel to the coating surface, run through the middle of the coating nor through the interface between coating and substrate, but rather runs through the substrate. The uniformity of the microstructure is ensured by the uniformity of the spraying powder and the process conditions.

The spraying powder can be homogeneously mixed with from 0 to 20% by weight of zirconium boride powder preferably having a similar particle size distribution as in the case of the titanium boride spraying powder and can be processed in the same manner. Preference is given to plasma spraying a coating containing from 0.2 to 16% by weight, in particular from 2.5 to 12% by weight, of zirconium boride. It is also possible to mix borides of transition metals of groups IV, V and VI of the Periodic Table, if desired also a boride of aluminum, into the spraying powder or spraying powder mixture, preferably in the preferred particle size distribution and in an amount of up to 12% by weight, particularly preferably up to 6% by weight, very particularly preferably up to 2% by weight. The addition of these additives is not restricted by the process, but rather by the further properties of the coating for the intended use, e.g. by the chemical resistance toward liquid aluminum and the electrolyte melt at operating temperatures. The proportion of titanium boride is preferably from 84 to 99.99% by weight, in particular from 88 to 99.95% by weight, particularly preferably more than 94 or 99.9% by weight, especially from 97 to 99.85% by weight, most preferably about 99.8% by weight.

According to the invention, the process is used primarily to coat substrates composed of carbon or/and graphite, in particular partially or fully graphitized carbon bodies. The substrate coated is preferably a carbon body
- which has been heated to temperatures of not more than 1400° C. during its production,
- which has been heated to temperatures in the range from 1600 to 3000° C. during its production or
- which has been heated to temperatures of not more than 1400° C. during its production and which comprises binder coke, ingraphitized filler coke and a further filler comprising at least 30% by weight of particulate electrographite.

However, it is also possible to coat substrates made of other materials such as steel, other metals or alloys and ceramic, in particular refractory metals and hard materials, and also composite materials. The coated substrates can also, according to the invention, be used for other purposes, for example as electrode, in particular as cathode element, as heating element, as refractory lining, as heat shield, as wear-resistant element or as containers, in particular as crucibles or vaporization boats, as a nozzle, as an element of a heat exchanger or nuclear reactor.

A characteristic of the process is that the substrate can be plasma-coated in only one or two passes. Preferably, the entire thickness of the coating is applied in one pass and the entire substrate is coated without interruption in one piece on an area having a length of up to 4000 mm and a width of up to 800 mm. A single process step leads to a lower oxygen content of the coating and to shorter coating times.

In addition, prior to plasma-coating with spraying powder or spraying powder mixture comprising titanium boride, an intermediate layer can be applied between substrate and coating in order to accommodate the different coefficients of thermal expansion. However, according to the invention the process parameters are preferably selected so that this intermediate layer can be omitted for cost reasons. This intermediate layer can consist of the same or a chemically very similar material as the protective layer and have, if desired, a higher porosity or can consist of a different material having an appropriate coefficient of expansion.

Preference is given to applying a coating having a titanium boride content of at least 95% by weight of titanium boride and a porosity of not more than 8% by volume to the substrates. In particular, it contains from 96 to 100% by weight, particularly preferably from 97.5 to 99.8% by weight, of titanium boride and has a porosity of from 3 to 7% by volume. Borides, carbides, nitrides or/and silicides of aluminum or/and metals of groups IV, V and VI of the Periodic Table (Ti—Cr, Zr—Mo, Hf—W) are advantageously added to the spraying powder or spraying powder mixture. If relatively large amounts of a plurality of these compounds are added, it is advisable to make the content of borides the highest. The contents of borides are particularly preferably up to 12% by weight, very particularly preferably up to 8% by weight, and the contents of carbides, nitrides or/and suicides of each of these three classes of compound are particularly preferably up to 6% by weight, very particularly preferably up to 3% by weight.

The process of the invention is suitable for applying a join-free coating to substrates of any shape. Electrodes and other large-area carbon and graphite bodies can be coated therewith. The process is particularly advantageous for coating large carbon cathode elements for aluminum melt flux electrolysis. The individual cathode elements customarily have a length up to 4000 mm and a width up to 800 mm. These areas can be coated in one piece without interruption. The height of a cathode element is customarily from 400 to 500 mm and the weight of a cathode element is up to 2.5 metric tons.

EXAMPLES

The carbon or graphite bodies provided as substrates were, after manufacture, surface machining by milling and cleaning, stored dry and in the absence of dust and were introduced in a corresponding condition into a vacuum coating chamber in order to be coated. The plasma burner was movable in x, y, z directions. The chamber was first evacuated to a residual pressure of about $10^{-2}$ mbar and then flooded with argon (grade 5.0), thus increasing the atmospheric pressure to from 800 to 900 mbar, except for individual experiments as shown in Table I. After igniting the plasma burner, the arc voltage was adjusted to values of from 60 to 78 V. The plasma gas consisted of an argon/hydrogen mixture. To enable the process parameters to be set according to the invention, use was made of a spraying powder or spraying powder mixture which had a mean particle size of 10–55 μm, preferably 20–30 μm. The particle size distribution of the spraying powder or spraying powder mixtures was measured using a Malvern Mastersizer X instrument; here, particular attention was paid to representative sampling and good dispersion using sodium polyphosphate as dispersant. The oxygen and carbon contents were determined by means of carrier gas extraction using an instrument from Leco. The spraying powder or spraying powder mixture having the preferred specification, except for individual experiments shown in Table II, was blown into the plasma flame by means of a carrier gas and deposited on the substrate surface which was located about 60–100 mm from the plasma nozzle. At a plasma burner power of from 45 to 60 kW and a plasma gas flow of about 55 l/min, the powder feed rate at which the spraying powder or spraying powder mixture is fed to the plasma flame was at least 30 g of powder per minute. The plasma burner was a special model manufactured by Medicoat AG having a burner power of 50 kW, a nozzle geometry developed specifically for the preferred spraying powders and process conditions and an increased cooling power. It scanned across the surface in lines. The speed of movement and the spacing between the individual lines was set so that the desired layer thickness was achieved in preferably one, at most two, passes. Layer thicknesses of from 0.1 mm to 1 mm were sought. The temperature of the substrate during plasma spraying was in the range from 100 to 400° C. In the case of a relatively long coating time, care was taken to ensure that the composition of the atmosphere could not change to a greater extent by introduction of, for example, hydrogen, by pumping out continuously or at certain intervals and circulating via filters to remove the dust formed.

In trials, both bodies made of carbon and in parallel thereto also of graphite of the grades "5BDN", "5BGN" and "BN" manufactured by SGL CARBON AG were introduced into a vacuum coating chamber and coated on one surface as described above. Substrates having a length of 550 mm, a width of 100 mm and a height of 150 mm were used for this purpose.

The following relationships, inter alia, were examined:

influence of the chamber pressure on the porosity of the coating, on the deposition efficiency and on the layer thickness (Table I), influence of the spraying powder composition, the spraying powder particle size, the plasma gas composition and the powder feed rate on the porosity of the coating and on the deposition efficiency (Table II) and influence of the total oxygen content or the ratio of oxygen content to carbon content in the spraying powder on the oxygen content of the plasma-sprayed coating (Table III).

The porosity was determined by means of computer-aided automated image analysis of reflected-light micrographs of polished sections in the form of transverse sections through the coating.

The electrical resistance was determined as 0.5 $\mu\Omega\cdot m$ by means of two points at a distance of 4 cm on a medium-sized carbon cathode element provided with a coating according to the invention corresponding to Experiment 8 of Table II.

TABLE I

Determination of the appropriate chamber pressure

| Experiment number | 1 | 2 | 3 | 4 | 5 | 6 | 7 | 8 |
|---|---|---|---|---|---|---|---|---|
| Spraying powder | $TiB_2$ | $TiB_2$ | $TiB_2$ | $TiB_2$ | $TiB_2$ | $TiB_2$ | $TiB_2$ | $TiB_2$ |
| Atmospheric chamber pressure (mbar) | 200 | 300 | 500 | 750 | 800 | 900 | 950 | 1100 |
| Arc voltage (V) | 63 | 64 | 65 | 68 | 69 | 71 | 72 | 75 |
| Porosity (% by volume) | n.d. | n.d. | n.d. | 4.9 | 5.4 | 6.1 | 7.0 | 10 |
| Deposition efficiency (%) | 0 | 2.5 | 15 | 60 | 66 | 71 | 73 | 80 |
| Layer thickness (mm) | 0 | 0.01 | 0.10 | 0.4 | 0.43 | 0.48 | 0.5 | 0.55 | n.d. = not determined

The processing of spraying powder mixtures consisting of

80% by weight of $TiB_2$/20% by weight of $ZrB_2$,

90% by weight of $TiB_2$/10% by weight of $ZrB_2$,

95% by weight of $TiB_2$/5% by weight of $ZrB_2$,

100% by weight of $TiB_2$, 99.5% by weight of $TiB_2$/0.5% by weight of $M_xB_y$ or 98% by weight of $TiB_2$/2% by weight of $M_xB_y$ having an appropriate particle size distribution at optimized process parameters gave no significant difference in the deposition efficiency and in the porosity. $M_xB_y$ is a boride of a transition metal of group IV, V or VI of the Periodic Table. A composite material consisting of 98% by weight of $TiB_2$ and 2% by weight of $ZrB_2$ is particularly useful for the coating of cathode elements for aluminum melt flux electrolysis owing to its reduced brittleness.

TABLE II

Influence of the particle size distribution, the plasma gas composition and the powder feed rate

| Experiment number | 1 | 2 | 3 | 4 | 5 | 6 | 7 | 8 | 9 | 10 | 11 | 12 |
|---|---|---|---|---|---|---|---|---|---|---|---|---|
| Mean particle size $d_{50}$ (μm) | 8.1 | 10.2 | 20.9 | 25.1 | 29.7 | 29.7 | 29.7 | 29.7 | 29.7 | 42.9 | 50.5 | 56.4 |
| Fines content (<3 μm) (%) | 6.5 | 1.0 | 0.8 | 0.5 | 0.3 | 0.3 | 0.3 | 0.3 | 0.3 | 0.2 | 0 | 0 |
| Content of coarse material (>90 μm) (%) | 0 | 0 | <0.1 | <0.1 | <0.1 | <0.1 | <0.1 | <0.1 | <0.1 | 2.1 | 3.7 | 6.5 |
| $d_{10}$ (μm) | 3.5 | 3.9 | 10.8 | 15.0 | 17.5 | 17.5 | 17.5 | 17.5 | 17.5 | 25.0 | 29.0 | 31.8 |
| $d_{90}$ (μm) | 13.4 | 21.4 | 34.2 | 40.0 | 44.0 | 44.0 | 44.0 | 44.0 | 44.0 | 72.0 | 78.9 | 85.0 |
| Plasma gas Ar/$H_2$ (% by volume) | 75/25 | 75/25 | 75/25 | 75/25 | 60/40 | 70/30 | 80/20 | 75/25 | 75/25 | 75/25 | 75/25 | 75/25 |
| Powder feed rate (g/min) | 50 | 50 | 50 | 50 | 50 | 50 | 50 | 30 | 60 | 50 | 50 | 50 |
| Deposition efficiency (%) | -*) | 55 | 69 | 73 | 76 | 76 | 68 | 78 | 71 | 60 | 49 | 32 |
| Porosity (%) | -*) | 3.9 | 4.2 | 5.5 | 5.9 | 6.1 | 6.4 | 6.1 | 7.3 | 8.1 | 9.5 | 12.8 |

-*) Plasma burner nozzle becomes blocked

TABLE III

Influence of the total oxygen content and the ratio of oxygen content to carbon content of the spraying powder on the oxygen content of the coating

| Experiment number | 1 | 2 | 3 | 4 | 5 | 6 | 7 |
|---|---|---|---|---|---|---|---|
| Total O content of the powder (% by weight) | <0.1 | 0.2 | 0.4 | 0.6 | 1.0 | 1.5 | 2.0 |
| O/C ratio of the powder | — | 2:1 | 4:1 | 1.5:1 | 1:1 | 0.7:1 | 0.6:1 |
| Oxygen content of the coating (% by weight) | <0.1 | 0.12 | 0.35 | 0.45 | 0.5 | 0.97 | 1.5 |

Experiments 2 to 4 were carried out using spraying powders which had a carbon content resulting from the production process of about 0.1 or 0.15% by weight. In Experiments 5 to 7, the carbon content was set in a targeted manner by mixing in carbon black.

What is claimed is:

1. A process for producing a coating having a titanium diboride content of at least 80% by weight, which comprises applying a spray powder coating of titanium diboride approximately 98% by weight and 2% by weight zirconium diboride having a thickness of from 0.1 mm to 1 mm, a porosity of not more than 10% by volume and an oxygen content of less than 1% by weight to the surface of a substrate by plasma spraying in an atmosphere which is virtually or completely free of oxygen, with no metal powder being added to the spray powder.

2. The process as claimed in claim 1, wherein substrates are coated on an area of at least 1 m².

3. The process as claimed in claim 1 wherein the spray powder is fed into a plasma flame at a powder feed rate of at least 30 g of powder per minute.

4. The process as claimed in claim 1, wherein a spray powder having a mean powder particle size of from 10 to 55 μm is substantially or completely melted in a plasma flame in order to apply the coating.

5. The process as claimed in claim 1, wherein a spray powder having a content of particles smaller than or equal to 3 μm of less than or equal to 1% by weight is melted in order to apply the coating.

6. The process as claimed in claim 1, wherein a coating having a content of metallic impurities of less than 1% by weight is produced.

7. The process as claimed in claim 1, wherein a spray powder whose oxygen content in the absence of carbon in the powder is less than or equal to 1% by weight is melted in order to apply the coating.

8. The process as claimed in claim 1, wherein a spray powder having a ratio of oxygen content to carbon content of from 0.7:1 to 5:1 is melted.

9. The process as claimed in claim 1, wherein plasma spraying is carried out in a virtually or completely oxygen-free atmosphere at a pressure of at least 500 mbar.

10. The process as claimed in claim 1, wherein a plasma flame is operated using a plasma gas mixture consisting essentially of argon and hydrogen.

11. The process as claimed in claim 1, wherein a substrate comprising carbon or/and graphite is coated.

12. The process as claimed in claim 1, wherein the substrate which is coated is a carbon body which has been heated to temperatures of not more than 1400° C. during its production, which has been heated to temperatures in the range from 1600 to 3000° C. during its production or which has been heated to temperatures of not more than 1400° C. during its production and which comprises binder coke, ungraphitized filler coke and a further filler comprising at least 30% by weight of particulate electrographite.

13. The process as claimed in claim 1, wherein the substrate is plasma-coated in one or two passes.

14. The process as claimed in claim 1, wherein an electrode is coated.

15. The process as claimed in claim 1, wherein, prior to the plasma-coating with spray powder comprising titanium diboride, an intermediate layer is applied.

* * * * *